United States Patent
Nakamura et al.

(10) Patent No.: US 8,515,367 B2
(45) Date of Patent: Aug. 20, 2013

(54) TRANSMISSION CIRCUIT AND TRANSMISSION METHOD

(75) Inventors: Maki Nakamura, Kanagawa (JP); Kaoru Ishida, Kanagawa (JP)

(73) Assignee: Panasonic Corporation, Osaka (JP)

(*) Notice: Subject to any disclaimer, the term of this patent is extended or adjusted under 35 U.S.C. 154(b) by 78 days.

(21) Appl. No.: 13/383,609

(22) PCT Filed: May 13, 2011

(86) PCT No.: PCT/JP2011/002687
§ 371 (c)(1),
(2), (4) Date: Jan. 12, 2012

(87) PCT Pub. No.: WO2011/148584
PCT Pub. Date: Dec. 1, 2011

(65) Prior Publication Data
US 2012/0105151 A1 May 3, 2012

(30) Foreign Application Priority Data
May 28, 2010 (JP) .................................. 2010-122979

(51) Int. Cl.
*H04B 1/04* (2006.01)
(52) U.S. Cl.
USPC ............. 455/127.1; 455/108; 455/114.3; 455/118; 455/127.2; 455/127.3; 375/296; 375/297; 375/312; 330/129; 330/133
(58) Field of Classification Search
USPC ............. 455/91, 108, 114.3, 118, 128, 126, 455/127.1, 127.2, 127.3; 375/295, 296, 297, 375/312; 330/129, 133
See application file for complete search history.

(56) References Cited

U.S. PATENT DOCUMENTS

| 7,177,607 B2* | 2/2007 | Weiss ........................ 455/127.1 |
| 2004/0071225 A1 | 4/2004 | Suzuki et al. |

(Continued)

FOREIGN PATENT DOCUMENTS

| CN | 1527583 A | 9/2004 |
| CN | 1833367 A | 9/2006 |
| JP | 2004-104194 A | 4/2004 |
| JP | 2004-289812 A | 10/2004 |

(Continued)

OTHER PUBLICATIONS

International Search Report for PCT/JP2011/002687 dated Jul. 26, 2011.

*Primary Examiner* — Tuan Pham
(74) *Attorney, Agent, or Firm* — Pearne & Gordon LLP

(57) ABSTRACT

Provided is a transmission circuit capable of compensating a variation in output power caused due to a temperature change or an individual variability when the operation mode is switched without an increase in the size of the transmission circuit which switches the operation mode between a linear operation mode and a nonlinear operation mode, and capable of suppressing the deterioration of the quality of a transmission signal. In the transmission circuit, a gain setting section (160) sets the gain (target gain) of a variable gain amplifier (140), to a value which enables the variable gain amplifier (140) to operate linearly and corresponds to a comparison result (output error level) obtained through comparison between the target level of the variable gain amplifier (140) corresponding to the set power level of the transmission signal and the power level of an output signal of the variable gain amplifier (140) detected by a power detection section (150). The variable gain amplifier (140) amplifies an amplitude phase modulation signal or a phase modulation signal (phase path signal) in accordance with the target gain set by the gain setting section (160).

7 Claims, 7 Drawing Sheets

(56) References Cited

U.S. PATENT DOCUMENTS

| | | |
|---|---|---|
| 2004/0185803 A1 | 9/2004 | Tanabe et al. |
| 2007/0147541 A1* | 6/2007 | Saito .............................. 375/297 |
| 2008/0153438 A1 | 6/2008 | Arayashiki et al. |
| 2009/0258611 A1 | 10/2009 | Nakamura et al. |
| 2010/0019840 A1* | 1/2010 | Takahashi ......................... 330/3 |

FOREIGN PATENT DOCUMENTS

| | | |
|---|---|---|
| JP | 2005-064662 A | 3/2005 |
| JP | 2009-218996 A | 9/2009 |
| JP | 2009-273110 A | 11/2009 |
| WO | 2008-044276 A1 | 4/2008 |
| WO | 2008044284 A1 | 4/2008 |

* cited by examiner

TRANSMISSION CIRCUIT AND TRANSMISSION METHOD

TECHNICAL FIELD

The present invention relates to a transmission circuit and a transmission method for use in mobile phones or communication apparatuses including a wireless local area network (LAN). More particularly, the present invention relates to a transmission circuit and a transmission method switching between two modulation schemes, that is, a polar modulation scheme and a quadrature modulation scheme.

BACKGROUND ART

As a conventional transmission circuit, for example, there is a transmission circuit that generates a transmission signal by using a quadrature modulation scheme. Since the transmission circuit using the quadrature modulation scheme is widely known, the description thereof will be omitted. Further, as a conventional transmission circuit which operates more efficiently than a quadrature modulation circuit, for example, there is a known modulation circuit that uses an envelope elimination and restoration (EER) modulation scheme or a polar modulation scheme. According to such modulation schemes, an input signal is separated into a phase component signal and an amplitude component signal. First, the phase component signal is multiplied by an oscillation signal generated by an oscillator to generate a phase modulation signal with a constant amplitude. Next, by using a saturation amplifier, the amplitude component signal is amplified and synthesized with the phase modulation signal to generate a transmission signal.

The EER modulation scheme features that the saturation amplifier is used to synthesize the amplitude component with the phase modulation signal. The EER modulation scheme further features that it can generate a transmission signal with a high power efficiency because the saturation amplifier is operated in a saturation region.

However, when an output level of the transmission signal is low, in the EER modulation scheme, power efficiency may deteriorate due to the deviation of the amplifier from the saturation region, or power efficiency may deteriorate due to an increase in a ratio of the power consumption of an amplitude modulation section to the entire power consumption. By this means, conventionally, a transmission circuit has been suggested which improves the power efficiency by producing a linear operation of an amplifier using the EER modulation scheme when the output is high and using the quadrature modulation scheme when the output is low (e.g., Patent Literature 1 (FIG. 6)). The operation of the transmission circuit disclosed in Patent Literature 1 will be described below (e.g., Patent Literature 1 (FIG. 6)).

An interface section receives an in-phase component signal (I signal) and a quadrature component signal (Q signal), which are quadrature scheme signals, from a baseband section. An Rθ conversion section of the interface section switches between the quadrature modulation scheme and the EER modulation scheme based on an auto gain control (AGC) control signal from the baseband section. In the quadrature modulation scheme, the Rθ conversion section performs through-output on the I signal and the Q signal without processing the signals, and in the EER modulation scheme, the Rθ conversion section converts (Rθ conversion process) the I signal and the Q signal into an amplitude component signal and a phase component signal, respectively. The Rθ conversion process is performed by extracting phase information and detecting an envelope by a limiter.

A digital-to-analog converter (DAC) receives as input the I signal when using the quadrature modulation scheme, whereas the DAC receives as input the phase component signal when using the EER scheme. Further, the DAC receives as input the Q signal when using the quadrature modulation scheme, whereas the DAC receives as input the amplitude component signal when using the EER modulation scheme.

A switch couples the output of the DAC to a Q component baseband filter of a radio frequency-integrated circuit (RF-IC) in the quadrature modulation scheme, and the switch couples the output of the DAC to an amplitude modulation signal in the EER modulation scheme.

A switch couples the sum of the I signal and the Q signal to an AGC amplifier in the quadrature modulation scheme, and the switch couples the phase component signal to the AGC amplifier in the EER modulation scheme. The switch couples the output of the AGC amplifier to an output buffer and outputs the resultant to a front-end section without bypassing a power amplifier in the quadrature modulation scheme, and the switch couples the output of the AGC amplifier to the power amplifier to amplify the output of the AGC amplifier in the EER modulation scheme.

In the quadrature modulation scheme, the input signal is converted into the I signal and the Q signal. The oscillation signal generated by the oscillator is separated into two signals by a phase shifter. One signal thereof is output to a mixer without phase shifting, and then is multiplied by the I signal by the mixer. The other signal thereof is output to the mixer after phase shifting, and then is multiplied by the Q signal by the mixer. The signals multiplied by the I signal and the Q signal are subsequently synthesized with each other by an adder, so that the synthesized signal becomes a modulation wave in accordance with the quadrature modulation scheme.

In accordance with the EER modulation scheme, the input signal is converted into the amplitude component signal and the phase component signal. The oscillation signal generated by the oscillator is first multiplied by the phase component signal to generate the phase modulation signal. Then, the power amplifier performs amplitude synthesis on the phase modulation signal and the amplitude component signal, so that a modulation wave is formed in accordance with the EER modulation scheme.

That is, the transmission circuit switches the modulation scheme, so that the quadrature modulation is performed when the power level of the signal is lower than a given value and the EER modulation is performed when the power level of the signal is higher than the given value. In this way, the conventional transmission circuit realizes a reduction in power consumption by using the quadrature modulation scheme and the EER modulation scheme in a combination manner.

CITATION LIST

Patent Literature

PTL 1
Japanese Patent Application Laid-Open No. 2004-104194 (FIG. 6)

SUMMARY OF INVENTION

Technical Problem

However, for example, the sensitivity to a characteristic change attributable to a temperature change, or the individual variability is different between the quadrature modulation scheme and the EER modulation scheme. For example, the sensitivity to an input power level with respect to an output power level of a high-frequency amplifier (power amplifier) is focused on.

In accordance with the quadrature modulation scheme, since the high-frequency amplifier performs a linear operation, a change in the power level input into the high-frequency amplifier accompanies a change in the output power level of the high-frequency amplifier. However, In accordance with the EER modulation scheme the high-frequency amplifier performs a nonlinear operation. Therefore, although the power level input into the high-frequency amplifier is changed, there is no significant change in the output power level of the high-frequency amplifier.

The sensitivity of the input power level corresponding to the output power level of the high-frequency amplifier is different between the quadrature modulation scheme and the EER modulation scheme. Specifically, the sensitivity of the input power level corresponding to the output power level of the high-frequency amplifier is higher in the quadrature modulation scheme, whereas the sensitivity of the input power level corresponding to the output power level of the high-frequency amplifier is lower in the EER modulation scheme.

Here, from the viewpoint of the stability of the output power level of the high-frequency amplifier, there is a concern that the output power level of the high-frequency amplifier may discontinue before and after the modulation scheme is switched between the two modulation schemes. For example, the power level input into the high-frequency amplifier is changed when the gain of a variable gain amplifier is changed due to a temperature change. Further, the discontinuity of the output power level may occur since the sensitivity of the input power level corresponding to the output power level is different between the two modulation schemes.

FIG. 1 is a diagram illustrating a change in the output power with respect to a set power of a high-frequency amplifier. In FIG. 1, for example, a dotted line indicates a change in an output power level with respect to a set power level of the high-frequency amplifier when a gain is adjusted at room temperature in the factory shipment. In the factory shipment, as indicated by the dotted line, a gain is adjusted in advance at room temperature so that the output power level continues before and after an operation mode is switched.

On the other hand, in FIG. 1, a solid line indicates a change in the output power level with respect to the set power level of the high-frequency amplifier at the time of change in temperature. With a change in temperature, as indicated by the solid line, the output power level discontinues before and after the operation mode is switched due to the temperature change of the gain of the variable gain amplifier. The reason for causing the discontinuity is that the output power level of the high-frequency amplifier is considerably changed since the high-frequency amplifier performs the linear operation in the quadrature modulation scheme, whereas the output power level of the high-frequency amplifier is rarely changed since the high-frequency amplifier performs the nonlinear operation in the EER modulation scheme. Thus, the discontinuity in the output power level of the high-frequency amplifier before and after the operation mode is switched is caused due to the temperature change of the gain of the variable gain amplifier and the difference in the sensitivity of the input power level to the output power level of the high-frequency amplifier between the modes.

In order to prevent the output power level of the high-frequency amplifier from discontinuing, it is necessary to compensate the output power level of the high-frequency amplifier in accordance with a variability of the output power level. There is a method of compensating the variability of the output power level of the high-frequency amplifier, for example, to compensate the variability of the output power level by detecting the output power level of the high-frequency amplifier and feeding back the result.

However, the above compensation method has a problem in that a loss due to a detection circuit increases, since it is necessary to insert the detection circuit into the output of a high-power and high-frequency amplifier, or the size of a circuit increases, since it is necessary to provide a detection circuit detecting a power level in a high-frequency band.

Further, in the above compensation method, a loop processing time required for closed-loop control is taken, since a series of closed-loop controls are performed to detect the output power level and feedback the result. For this reason, it is difficult to apply this compensation method to a system, such as a universal mobile telecommunications system (UMTS), in which a time allocated to switching between a linear operation and a nonlinear operation is short.

It is therefore an object of the present invention is to provide a transmission circuit and a transmission method capable of suppressing deterioration in the quality of a transmission signal by compensating a variation in an output power level caused due to temperature change or individual variability occurring when the operation mode is switched without increasing the size of a transmission circuit which switches an operation mode between a linear operation mode and a nonlinear operation mode.

Solution to Problem

The transmission circuit of the present invention that includes a high-frequency power amplifier which has, as an operation mode, a nonlinear mode in which the high-frequency power amplifier operates as a nonlinear amplifier, and a linear mode in which the high-frequency amplifier operates as a linear amplifier, the high-frequency power amplifier outputting a transmission signal, employs a configuration having: a mode setting section that switches the operation mode to either the nonlinear mode or the linear mode in accordance with a set power level of the transmission signal; a signal generation section that converts an input signal into first and second signals in accordance with a mode signal which includes information regarding the operation mode set by the mode setting section; a power voltage control section that applies a power voltage corresponding to the first signal to the high-frequency power amplifier; a variable gain amplifier that amplifies the second signal; a detection section that detects a power level of the second signal amplified by the variable gain amplifier; and a first gain setting section that sets, irrespective of the operation mode, a gain of the variable gain amplifier to a value, which enables the variable gain amplifier to operate linearly and corresponds to a comparison result obtained through comparison between the detected power level and a target power level of the variable gain amplifier corresponding to the set power level.

The transmission method of the present invention that is a transmission method of a transmission circuit, which includes a high-frequency power amplifier having, as an operation mode, a nonlinear mode in which the high-frequency power amplifier operates as a nonlinear amplifier, and a linear mode in which the high-frequency amplifier operates as a linear amplifier, the high-frequency power amplifier outputting a transmission signal, the transmission method includes: switching the operation mode to either the nonlinear mode or the linear mode in accordance with a set power level of the transmission signal; converting an input signal into first and second signals in accordance with the operation mode; applying a power voltage corresponding to the first signal to the high-frequency power amplifier; amplifying the second signal using a variable gain amplifier; detecting a power level of the second signal amplified by the variable gain amplifier; and adjusting, irrespective of the operation anode, a gain of the variable gain amplifier to a value, which enables the variable gain amplifier to operate linearly and corresponds to a comparison result obtained through comparison between the detected power level and a target power level of the variable gain amplifier corresponding to the set power level.

Advantageous Effects of Invention

According to the present invention, it is possible to suppress deterioration in the quality of a transmission signal by compensating a variation in an output power level caused due to temperature change or individual variability occurring when the operation mode is switched without increasing the size of a transmission circuit which switches an operation mode between a linear operation mode and a nonlinear operation mode.

DESCRIPTION OF EMBODIMENTS

Hereinafter, embodiments of the present invention will be described in detail with reference to the drawings.

(Embodiment 1)

Figure 1:
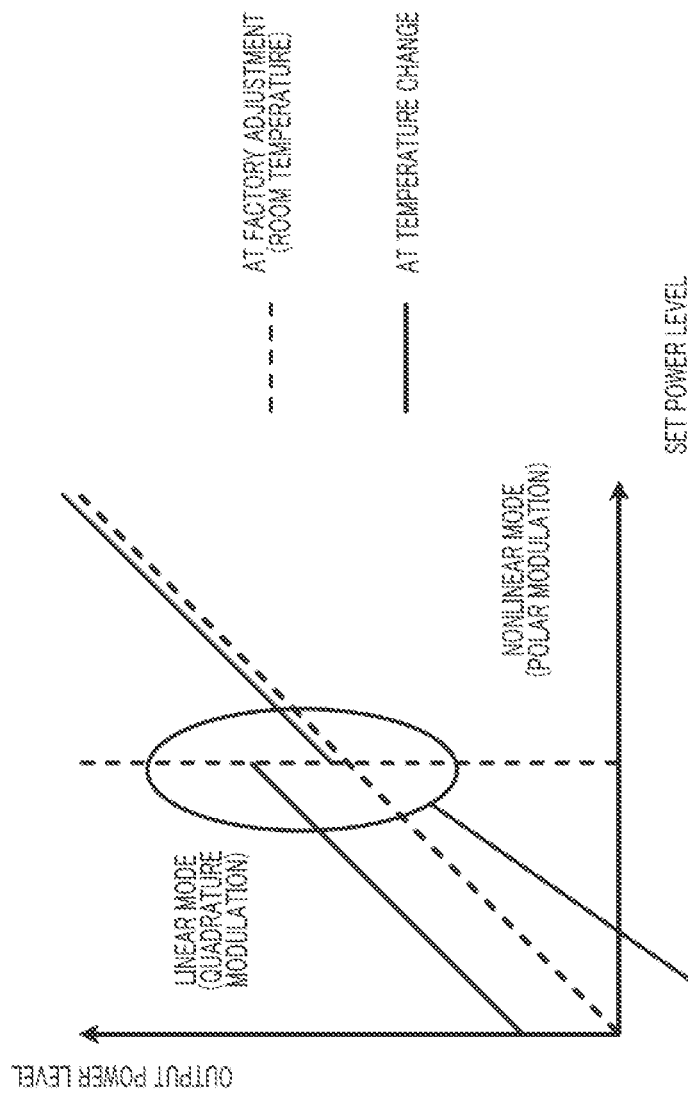
FIG. 1 is a diagram illustrating a change in an output power with respect to a set power of a high-frequency amplifier.
Figure 2:
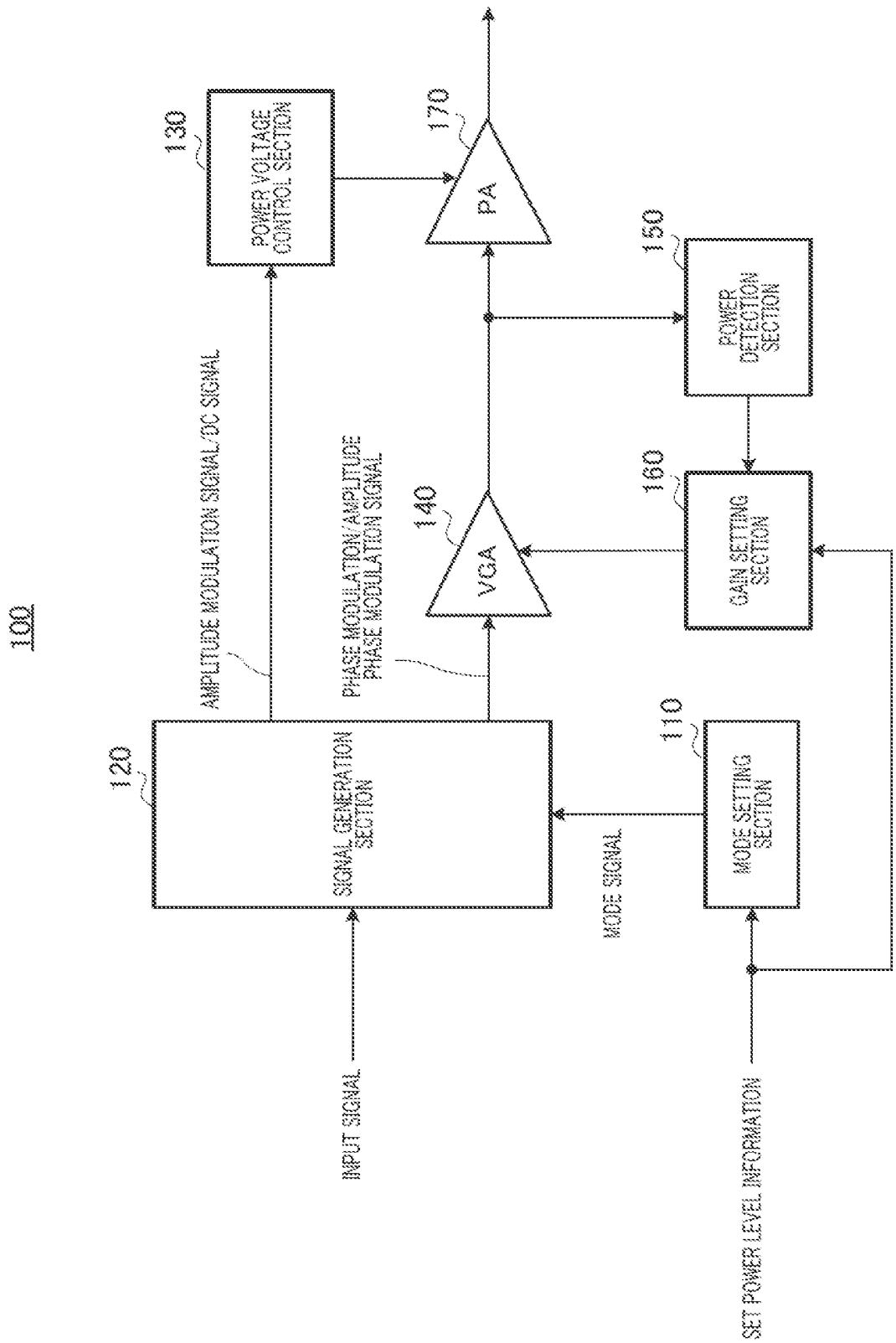
FIG. 2 is a diagram illustrating the configuration of main sections of a transmission circuit according to Embodiment 1 of the present invention.

FIG. 2 is a diagram illustrating the configuration of main sections of a transmission circuit according to an embodiment of the present invention. In FIG. 2, transmission circuit 100 includes mode setting section 110, signal generation section 120, power voltage control section 130, variable gain amplifier (VGA) 140, power detection section 150, gain setting section 160, and high-frequency power amplifier (PA) 170.

The present embodiment will describe a case where the present invention is applied to a transmission apparatus having a transmission circuit that supports a polar modulation scheme and a quadrature modulation scheme. In the present embodiment, transmission circuit 100 allows high-frequency power amplifier 170 to operate as a nonlinear amplifier in accordance with the polar modulation scheme. Transmission circuit 100 controls the amplitude modulation and an average output power level of a transmission signal based on the power voltage of high-frequency power amplifier 170. On the other hand, transmission circuit 100 allows high-frequency power amplifier 170 to operate as a linear amplifier in accordance with the quadrature modulation scheme. Transmission circuit 100 allows variable gain amplifier 140 at the front stage of high-frequency power amplifier 170 to control the average output power level of the transmission signal.

Hereinafter, a mode where transmission circuit 100 performs a polar modulation and operates high-frequency power amplifier 170 as the nonlinear amplifier is referred to as a nonlinear mode. A mode where transmission circuit 100 performs a quadrature modulation and operates high-frequency power amplifier 170 as the linear amplifier is referred to as a linear mode. That is, in the present embodiment, transmission circuit 100 performs the polar modulation in the nonlinear mode, whereas transmission circuit 100 performs the quadrature modulation in the linear mode. The present invention is not limited to the transmission circuit using the polar modulation scheme and the quadrature modulation scheme, but can be broadly applied to a transmission apparatus that controls transmission power by switching an operation mode between the mode of operating high-frequency power amplifier 170 as the nonlinear amplifier and the mode of operating high-frequency power amplifier 170 as the linear amplifier in accordance with the size of a transmission power level.

Mode setting section 110 sets the operation mode in response to an instruction from the outside and outputs information regarding the set operation mode as a mode signal to signal generation section 120. A method of setting the operation mode will be described later.

Signal generation section 120 receives as input a mode signal and modulation data (hereinafter, referred to as an input signal) as data to be transmitted. Signal generation section 120 converts an input signal in the following manner in accordance with the operation mode indicated by the mode signal. In the nonlinear mode, signal generation section 120 separates the input signal into a phase modulation signal and an amplitude modulation signal, and outputs the phase modulation signal to variable gain amplifier 140 and outputs the amplitude modulation signal to power voltage control section 130. On the other hand, in the linear mode, signal generation section 120 generates an amplitude phase modulation signal and a direct current (DC) signal in accordance with the input signal, and outputs the amplitude phase modulation signal to variable gain amplifier 140 and outputs the DC signal to power voltage control section 130.

Power voltage control section 130 controls the power voltage of high-frequency power amplifier 170 in response to the amplitude modulation signal or the DC signal (hereinafter, also referred to as an "amplitude path signal") output from signal generation section 120. Power voltage control section 130 is configured by using, for example, a regulator and applies the power voltage corresponding to the amplitude path signal to high-frequency power amplifier 170.

Variable gain amplifier 140 amplifies the phase modulation signal or the amplitude phase modulation signal (hereinafter, also referred to as a "phase path signal") output from signal generation section 120, based on gain information output from gain setting section 160 (described later), and outputs the amplified phase modulation signal or the amplified amplitude phase modulation signal, to high-frequency power amplifier 170 and power detection section 150. The gain information includes information regarding the target gain of variable gain amplifier 140. Here, the target gain is a gain which variable gain amplifier 140 sets.

In the present embodiment, irrespective of the operation mode, variable gain amplifier 140 is made to operate in a linear operation region. That is, as variable gain amplifier 140, the present embodiment employs an amplifier having a feature in which the linear operation region includes the target gain which is likely to be set by gain setting section 160.

Power detection section 150 detects for each slot the power level of the phase modulation signal or the amplitude phase modulation signal output from variable gain amplifier 140 and outputs the power level detected for each slot to gain setting section 160.

Gain setting section 160 sets the gain of variable gain amplifier 140. Specifically, gain setting section 160 receives as input information regarding the actual output power level of variable gain amplifier 140 detected for each slot by power detection section 150 and information (hereinafter, referred to as "set power level information") of the output set power level for each slot. Gain setting section 160 compares the actual output power level of variable gain amplifier 140 to the ideal output power level (hereinafter, referred to as a "set power level") of variable gain amplifier 140 determined based on the set power level information. Then, as the comparison result, gain setting section 160 calculates an error (hereinafter, referred to as an "output level error") of the output power level corresponding to the set power level.

Gain setting section 160 determines the gain (target gain) of variable gain amplifier 140 at the subsequent slot based on the error of the output power level. Specifically, gain setting section 160 determines the target gain of variable gain amplifier 140 to cancel the error of the output power level at the subsequent slot based on the set power level of the current slot and the error of the output power level calculated at the immediately previous slot. Gain setting section 160 outputs information (gain information) regarding the determined target gain of variable gain amplifier 140 to variable gain amplifier 140.

High-frequency power amplifier 170 amplifies the phase modulation signal or the amplitude phase modulation signal amplified by variable gain amplifier 140 in accordance with the power voltage applied from power voltage control section 130. For example, high-frequency power amplifier 170 includes a bipolar transistor, a field effect transistor (FET), and a heterojunction bipolar transistor (HBT).

The operation of transmission circuit 100 having the above-described configuration will be described.

Transmission circuit 100 switches the operation mode to one of the linear mode and the nonlinear mode in response to an instruction from the outside. That is, in the present embodiment, transmission circuit 100 switches the modulation scheme to one of the quadrature modulation scheme and the polar modulation scheme in response to the instruction from the outside.

An example of the instruction from the outside includes an instruction from a base station. For example, when a communication apparatus mounting transmission circuit 100 communicates with the base station; the base station outputs an instruction to raise the output power level of the transmission signal to the communication apparatus in a poor communication environment. The communication apparatus delivers the instruction (set power level information) to change the set power level of the transmission signal to transmission circuit 100 mounted on the communication apparatus.

When receiving the set power level information, transmission circuit 100 changes the set power level of the transmission signal at timing of the boundary of communication units (slots). When it is necessary to switch the operation mode at the time of changing the set power level, the modulation mode and the nonlinear mode are switched at timing of the boundary of the same slots, that is, the quadrature modulation scheme/polar modulation scheme are simultaneously switched.

Specifically, mode setting section 110 of transmission circuit 100 switches the operation mode to one of the linear mode and the nonlinear mode in response to the instructed set power level information. For example, mode setting section 110 compares the set power level indicated by the set power level information to a predetermined threshold value. When the set power level is equal to or greater than the predetermined threshold value, mode setting section 110 switches the operation mode to the nonlinear mode. In this way, high-frequency power amplifier 170 is made to operate as the nonlinear amplifier, the amplitude modulation and the average output power level of the transmission signal are controlled based on the power voltage of high-frequency power amplifier 170, and then the output power level of the transmission signal is adjusted.

On the other hand, when the set power level indicated by the set power level information is less than the predetermined threshold value, mode setting section 110 switches the operation mode to the linear mode. In this way, high-frequency power amplifier 170 is made to operate as the linear amplifier, the transmission signal is amplified based on the power voltage of high-frequency power amplifier 170, and then, the output level of the transmission signal is adjusted.

Thus, mode setting section 110 switches the operation mode in accordance with the set power level of the transmission signal and outputs the mode signal used to instruct the operation mode to signal generation section 120.

Signal generation section 120 converts the input signal in the following manner in accordance with the operation mode indicated by the mode signal. In the nonlinear mode, signal generation section 120 separates the input signal into the phase modulation signal and the amplitude modulation signal. Then, signal generation section 120 outputs the phase modulation signal to variable gain amplifier 140 and outputs the amplitude modulation signal to power voltage control section 130.

On the other hand, in the linear mode, signal generation section 120 generates the amplitude phase modulation signal and the DC signal in accordance with the input signal. Then, signal generation section 120 outputs the amplitude phase modulation signal to variable gain amplifier 140 and outputs the DC signal to power voltage control section 130.

Then, in the linear mode (for example, when a low-output power level is designated in the set power level), the amplitude phase modulation signal is input to variable gain amplifier 140 and the DC signal with a constant amplitude is input to power voltage control section 130. On the other hand, in the nonlinear mode (for example, when a high-output power level is designated in the set power level), the phase modulation signal is input to variable gain amplifier 140 and the amplitude modulation signal is input to power voltage control section 130. For example, when the set power level of the transmission signal is not changed and the instruction of the set power level information is not input from the outside, one of operation modes determined in advance may be used.

Figure 3:
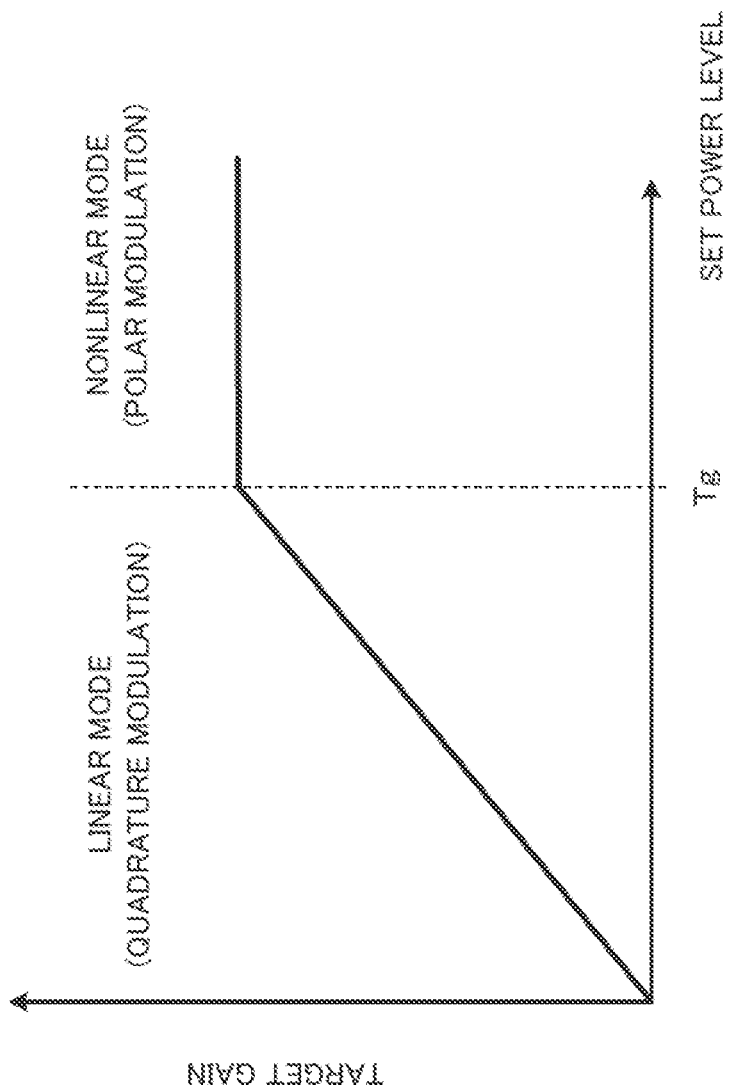
FIG. 3 is a diagram illustrating a correspondence relation among set power level information of a transmission signal, a target gain of a variable gain amplifier, and operation modes.

FIG. 3 is a diagram illustrating a correspondence relation among the set power level information of the transmission signal, the target gain of variable gain amplifier 140, and the operation modes. As described above, transmission circuit 100 operates in the linear mode when the set power level of the transmission signal is less than a predetermined threshold value. In the linear mode, the gain linearly corresponding to the set power level of a transmission signal one-to-one is set as the target gain of variable gain amplifier 140. Then, gain setting section 160 corrects the gain of variable gain amplifier 140 so that the power level of variable gain amplifier 140 is identical to the power level based on the set power level. Here, the set power level is the average output power level of the transmission signal.

As described above, transmission circuit 100 operates in the nonlinear mode when the set power level of the transmission signal is equal to or greater than the predetermined threshold value. In the nonlinear mode, a uniform gain is set as the target gain of variable gain amplifier 140 irrespective of the set power level of the transmission signal. Then, gain setting section 160 adjusts the power level of variable gain amplifier 140 to the uniform power level irrespective of the set power level of the transmission signal.

When the set power level is less than a predetermined threshold value Tg, transmission circuit 100 operates in the linear mode. When the set power level is equal to or greater than the predetermined threshold value Tg, transmission circuit 100 operates in the nonlinear mode.

Gain setting section 160 adjusts the gain of variable gain amplifier 140 in a similar manner even when the operation mode is switched. That is, when transmission circuit 100 is switched from the nonlinear mode to the linear mode, the target gain of variable gain amplifier 140 in the linear mode is set based on an output error level calculated in the nonlinear mode. When transmission circuit 100 is switched from the linear mode to the nonlinear mode, the target gain of variable gain amplifier 140 in the nonlinear mode is set based on an output error level calculated in the linear mode.

In the present embodiment, gain setting section 160 sets, as the target gain of variable gain amplifier 140, the gain corresponding to the set power level of the transmission signal irrespective of the operation mode in the region where variable gain amplifier 140 operates linearly. That is, in the present embodiment, variable gain amplifier 140 employs a variable gain amplifier having a feature in which the linear operation region includes all of the target gains corresponding to the level supposed as the set power level of the transmission signal.

In the present embodiment, since variable gain amplifier 140 operates linearly irrespective of the operation mode, the target gain of variable gain amplifier 140 in the other operation mode can be adjusted (corrected) based on the output error level calculated in one operation mode even in the case where the operation mode is switched.

Figure 4:
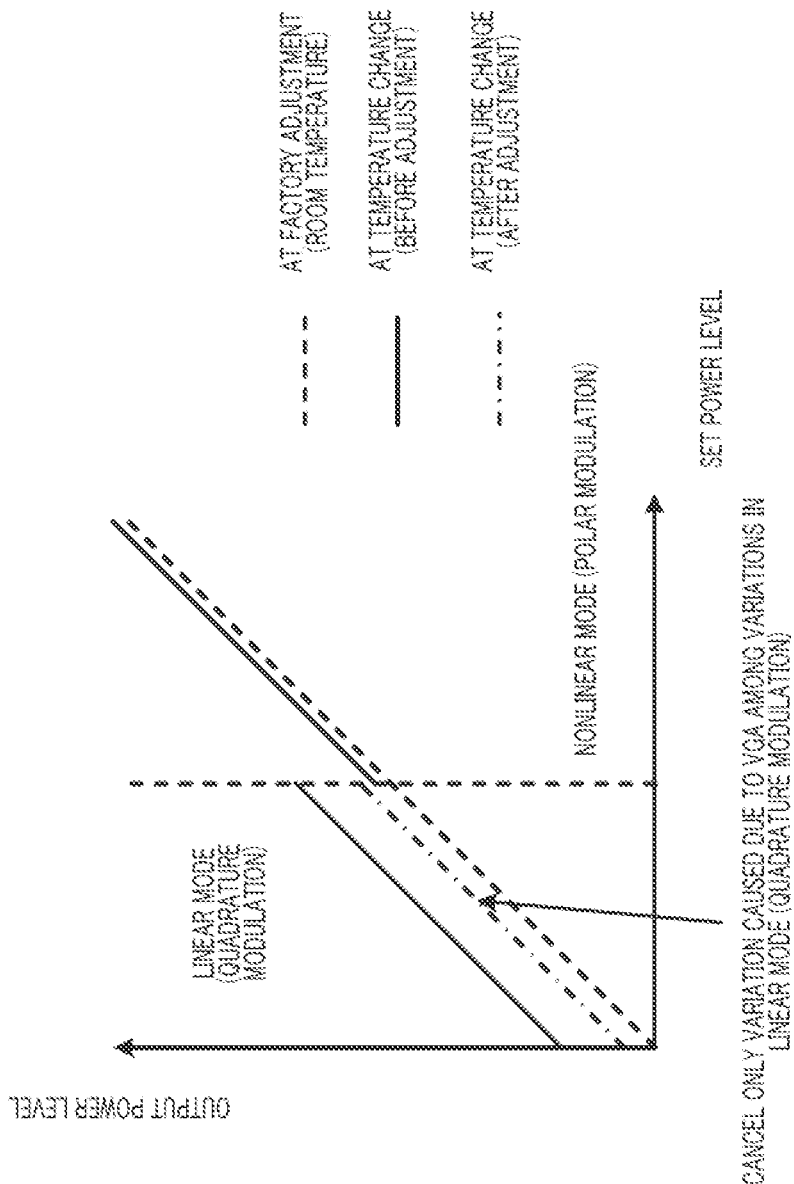
FIG. 4 is a diagram illustrating a relation between a set power level and an output power level of the high-frequency power amplifier.

FIG. 4 is a diagram illustrating a relation between the set power level and the output power level of high-frequency power amplifier 170 according to the present embodiment. In the present embodiment, as shown in FIG. 4, the difference between the output power level and the set power level in the linear mode is reduced, thereby improving the discontinuity of the output power level between the operation modes.

In the present embodiment, gain setting section 160 sets the gain (the target gain) of variable gain amplifier 140 to a value which enables variable gain amplifier 140 to operate linearly and corresponds to a comparison result (output error level) obtained through comparison between the target level of variable gain amplifier 140 corresponding to the set power level of the transmission signal and the power level of an output signal of variable gain amplifier 140 detected by power detection section 150. Then, variable gain amplifier 140 amplifies the amplitude phase modulation signal or the phase modulation signal (phase path signal) in accordance with the target gain set by gain setting section 160.

Then, even when the operation mode is switched, gain setting section 160 can adjust the gain of variable gain amplifier 140 in the switched operation mode based on the output error level calculated in the operation mode before switching. As a consequence, transmission circuit 100 switching the operation mode can suppress a change in the gain of variable gain amplifier 140 caused due to temperature change or individual variability without increasing the size of the circuit and can reduce the influence of the change in the gain of variable gain amplifier 140 on high-frequency power amplifier 170. Thus, since the variation in the output power level caused when the operation mode is switched is corrected, it is possible to suppress the deterioration in the quality of the transmission signal.

Variable gain amplifier 140 operates linearly irrespective of the operation mode. Therefore, since the gain can be adjusted at the immediately subsequent slot based on the output error level detected at the immediately previous slot of a slot at which the operation mode is switched, feedback control can be performed in a short time.

In the present embodiment, power detection section 150 detects low-output power of variable gain amplifier 140, compared to the output power of high-frequency power amplifier 170. Therefore, a signal loss can be suppressed compared to a case where power detection section 150 is disposed at the rear stage of high-frequency power amplifier 170. Further, power detection section 150 may be disposed at the rear stage of variable gain amplifier 140, so that power detection section 150 can detect the output power level of low power. Therefore, the size of the circuit can be reduced and low power consumption of the entire circuit can be realized compared to a case where power detection section 150 is disposed at the rear stage of high-frequency power amplifier 170 to detect the high-output power level.

(Embodiment 2)

Figure 5:
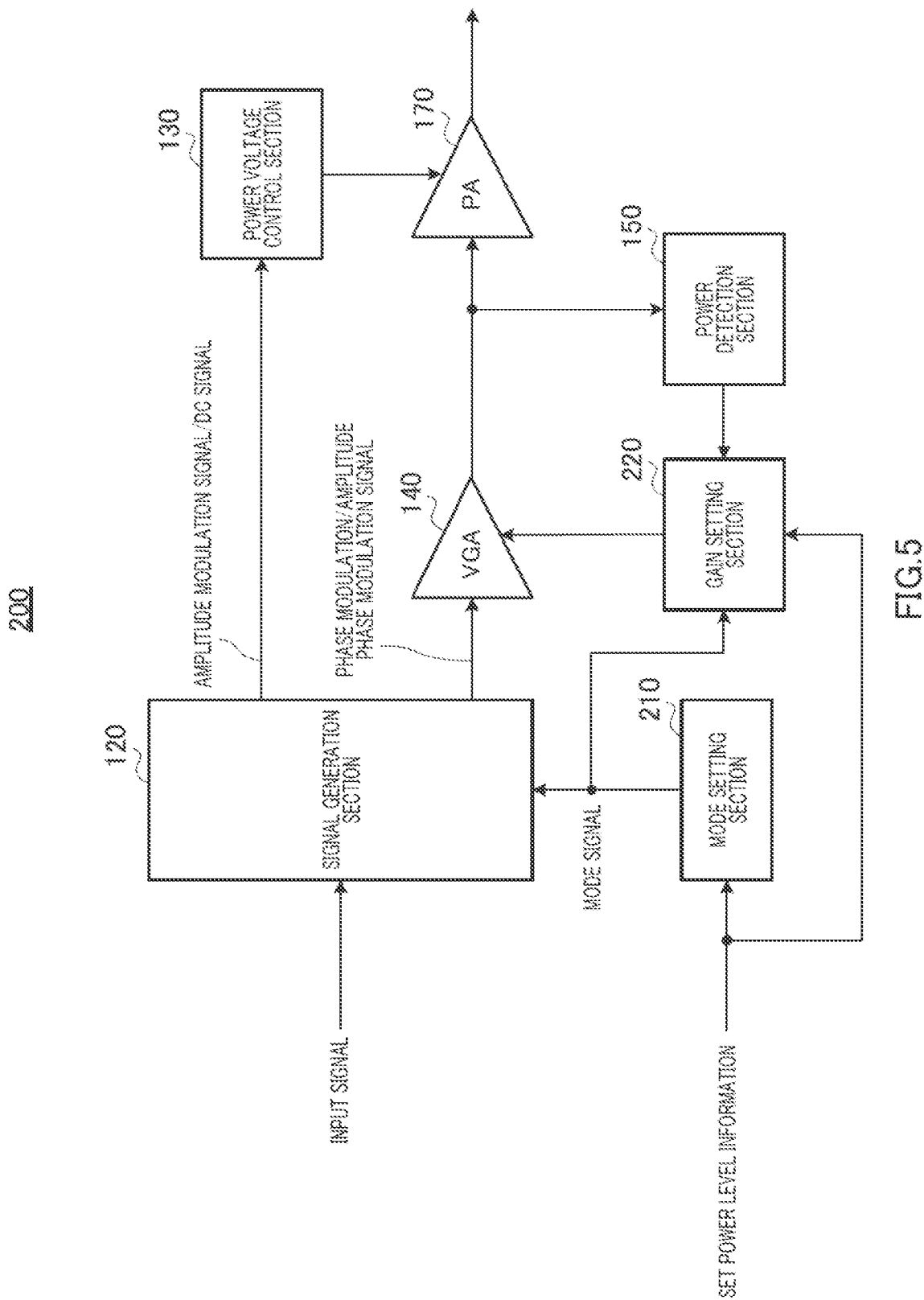
FIG. 5 is a diagram illustrating the configuration of main sections of a transmission circuit according to Embodiment 2 of the present invention.

FIG. 5 is a diagram illustrating the configuration of main sections of a transmission circuit according to an embodiment of the present invention. In the transmission circuit according to the present embodiment shown in FIG. 5, the same reference numerals as those of FIG. 2 are given to constituent elements common to the elements in FIG. 2 and the description thereof will be omitted. Compared to transmission circuit 100 in FIG. 2, in FIG. 5, transmission circuit 200 includes mode setting section 210 and gain setting section 220 instead of mode setting section 110 and gain-setting section 160.

Mode setting section 210 sets the operation mode in response to an instruction from the outside such as mode setting section 110. Further, mode setting section 210 outputs information regarding the set operation mode as a mode signal to signal generation section 120 and gain setting section 220.

Gain setting section 220 sets the gain of variable gain amplifier 140. Specifically, gain setting section 220 receives as input, at each slot, information regarding the actual output power level of variable gain amplifier 140 detected by power detection section 150, information (set power level information) regarding the output set power level for each slot, and the mode signal. Gain setting section 220 determines the operation mode in accordance with the mode signal. Further, when the operation mode is the linear mode, gain setting section 220 sets the target gain of variable gain amplifier 140. Since the method of setting the target gain of gain setting section 220 is the same as the method of gain setting section 160, the description thereof will be omitted.

When the operation mode is the linear mode, gain setting section 220 outputs information (gain information) regarding the set target gain of variable gain amplifier 140 to variable gain amplifier 140.

The operation of gain setting section 220 in the operation of transmission circuit 200 having the above-described configuration will be mainly described.

Like transmission circuit 100, transmission circuit 200 operates in accordance with the nonlinear mode when the set power level of the transmission signal is equal to or greater than a predetermined threshold value. In the nonlinear mode, high-frequency power amplifier 170 operates in the saturation region and the set power level of the transmission signal is adjusted by the power voltage of high-frequency power amplifier 170. Therefore, in the nonlinear mode, the power level of the phase modulation signal input to high-frequency power amplifier 170 is not uniform. Although the power level of the phase modulation signal is changed to some extent, an error of the output power level with respect to the set power level is small. In the nonlinear mode, there is a little change in the output power level caused due to the variation in the gain of variable gain amplifier 140. Therefore, even when the gain is adjusted, the error of the output power level with respect to the original set power level is small.

In the present embodiment, gain setting section 220 does not adjust the gain of variable gain amplifier 140 in the nonlinear mode, whereas adjusting the gain of variable gain amplifier 140 in the linear mode. Thus, in the linear mode in which the influence on high-frequency power amplifier 170 is large, the change in the gain of variable gain amplifier 140 is suppressed, thereby reducing the influence of the change in the gain of variable gain amplifier 140 on high-frequency power amplifier 170. Further, in the nonlinear mode in which the influence on high-frequency power amplifier 170 is small, gain setting section 220 does not adjust the gain of variable gain amplifier 140, thereby reducing a calculation amount compared to Embodiment 1.

In the present embodiment, when the operation mode is the linear mode, gain setting section 220 adjusts the gain (target gain) of variable gain amplifier 140 in accordance with the comparison result (output error level) obtained through the comparison between the target level of variable gain amplifier 140 corresponding to the set power level of the transmission signal and the power level of the output signal of variable gain amplifier 140 detected by power detection section 150.

Thus, it is possible to reduce the calculation amount compared to Embodiment 1. Further, in the linear mode in which the influence on high-frequency power amplifier 170 is large, the change in the gain of variable gain amplifier 140 is suppressed, thereby reducing the influence of the change in the gain of variable gain amplifier 140 on high-frequency power amplifier 170.

(Embodiment 3)

In Embodiment 1 and Embodiment 2, the variable gain amplifier operates linearly irrespective of the operation mode. Therefore, even before and after the operation mode is switched, the gain of the variable gain amplifier can be adjusted based on the output error level in the different operation modes.

The variable gain amplifier normally operates linearly, whereas the high-frequency power amplifier operates linearly or nonlinearly in accordance with the set power level. In a general operation environment of the transmission circuit, the characteristic of the high-frequency power amplifier is changed, when the circumference temperature is changed. For example, the change in the output power level differs, since the change in the gain is different at the time of changing the temperature of the high-frequency power amplifier between when the high-frequency power amplifier operates linearly and when the high-frequency power amplifier operates nonlinearly.

In the present embodiment, a transmission circuit will be described which suppresses the change in the output power level of the high-frequency power amplifier occurring between the operation modes with a change in temperature.

Figure 6:
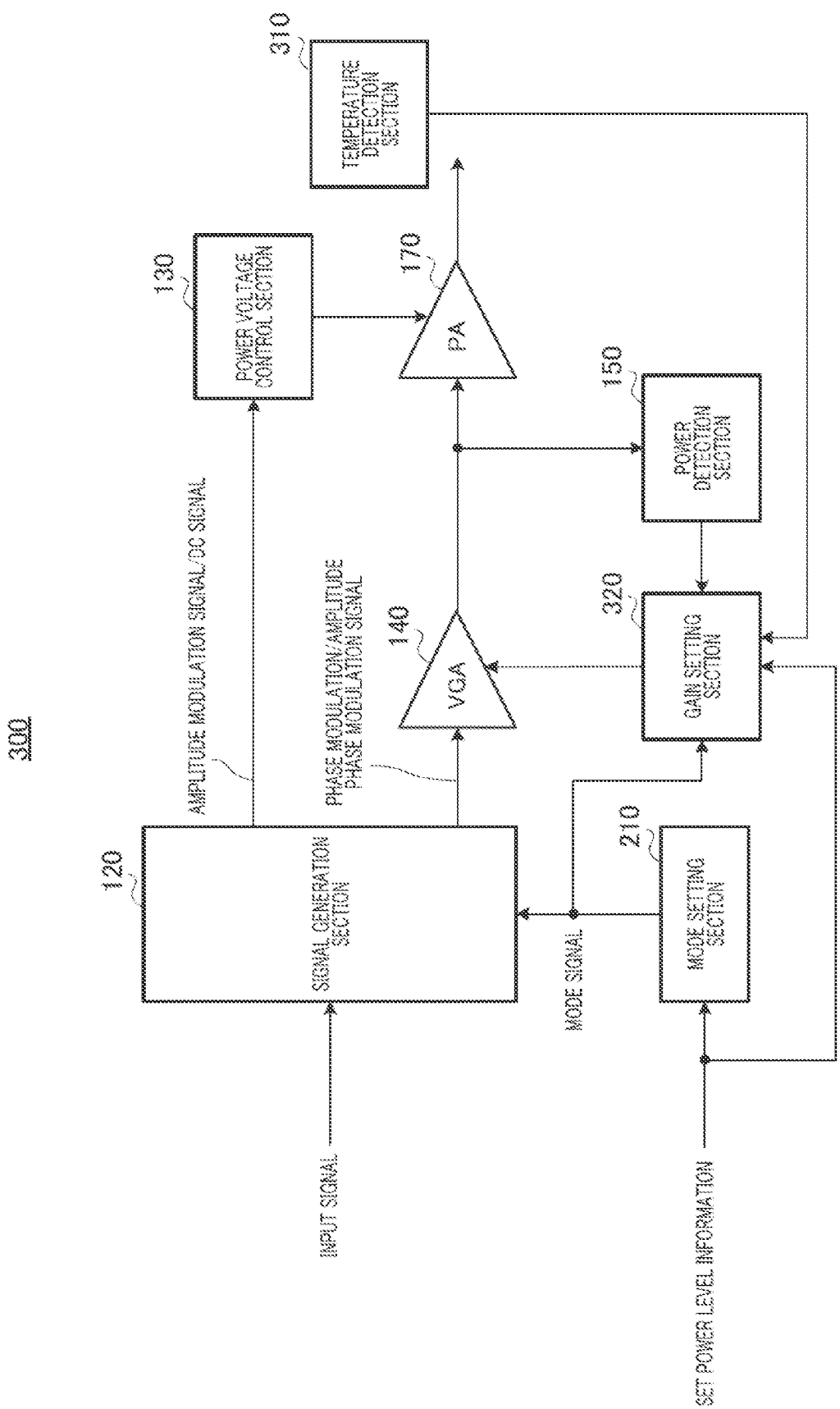
FIG. 6 is a diagram illustrating the configuration of main sections of a transmission circuit according to Embodiment 3 of the present invention.

FIG. 6 is a diagram illustrating the configuration of main sections of a transmission circuit according to an embodiment of the present invention. In the transmission circuit according to the present embodiment in FIG. 6, the same reference numerals as those of FIG. 5 are given to constituent elements common to the elements in FIG. 5 and the description thereof will be omitted. Compared to transmission circuit 200 of FIG. 5, in FIG. 6, transmission circuit 300 includes gain setting section 320 instead of gain setting section 160 and further includes temperature detection section 310 measuring the circumference temperature of high-frequency power amplifier 170.

Temperature detection section 310 measures the vicinity temperature or the circumference temperature of high-frequency power amplifier 170 and outputs the measurement result as temperature information to gain setting section 320.

Gain setting section 320 sets the gain of variable gain amplifier 140. Gain setting section 320 receives as input at each slot information regarding the actual output power level of variable gain amplifier 140 detected by power detection section 150, information (set power level information) regarding the output set level for each slot, and the mode signal. Like gain setting section 160, gain setting section 320 compares the actual output power level detected by power detection section 150 to the ideal output power level (set power level) determined from the set power level information. Then, like gain setting section 160, gain setting section 320 calculates an error (output level error) of the output power level with respect to the set power level.

In the present embodiment, gain setting section 320 estimates the gain change amount of high-frequency power amplifier 170 based on the temperature information acquired by temperature detection section 310. Specifically, gain setting section 320 has a table in which the temperature change matches a gain change amount, which is the amount of gain of high-frequency power amplifier 170 changed due to the temperature change, every two operation modes. Gain setting section 320 reads the gain change amount matching the temperature change from the table. Further, gain setting section 320 calculates a difference (hereinafter, referred to as a "gain difference") in the gain change amount between the two operation modes.

Gain setting section 320 sets the target gain of variable gain amplifier 140 at the subsequent slot, based on the output error level, the gain difference, and the mode signal.

Specifically, gain setting section 320 sets the target gain of variable gain amplifier 140 used to cancel the output error level at the subsequent slot based on the set power level of the current slot and the output error level calculated at the immediately previous slot, and to cancel the difference in the gain change amount between the two operation modes based on the gain difference at a timing at which the operation mode is switched. Gain setting section 320 outputs information (gain information) regarding the set target gain of variable gain amplifier 140 to variable gain amplifier 140.

In this way, in the present embodiment, temperature detection section 310 measures a vicinity temperature or a circumference temperature high-frequency power amplifier 170. Gain setting section 320 calculates the error (output error level) of the output power level with respect to the set power level. Further, gain setting section 320 estimates the gain change amount of high-frequency power amplifier 170 based on the temperature change and adjusts the target gain of variable gain amplifier 140 at the time of switching the operation mode, based on the difference in the gain change amount between the operation modes.

In this way, transmission circuit 300 corrects both the gain change of variable gain amplifier 140 and the gain change caused due to the temperature characteristic of high-frequency power amplifier 170. Accordingly, it is possible to suppress the gain change caused due to the different temperature characteristic of high-frequency power amplifier 170 in accordance with the operation mode. Thus, it is possible to compensate a distorted component caused due to the temperature change, thereby suppressing the deterioration in the quality of the signal.

(Embodiment 4)

In Embodiment 3, the transmission circuit with the above-described configuration has been described. That is, since the gain change amount of the high-frequency power amplifier with a change in temperature is different between when the high-frequency power amplifier operates linearly and when the high-frequency power amplifier operates nonlinearly, the change in the output power level is different. Accordingly, the transmission circuit suppresses the change in the output power level caused due to the gain change of the high-frequency power amplifier occurring between the operation modes with a change in temperature. With a change in temperature, the output power level of the high-frequency power amplifier is changed. Further, the power voltage supplied to the high-frequency power amplifier may be changed.

In the present embodiment, accordingly, a transmission circuit will be described which adjusts the power voltage supplied to the high-frequency power amplifier with a change in temperature and thus keeps the power voltage supplied to the high-frequency power amplifier to be constant.

Figure 7:
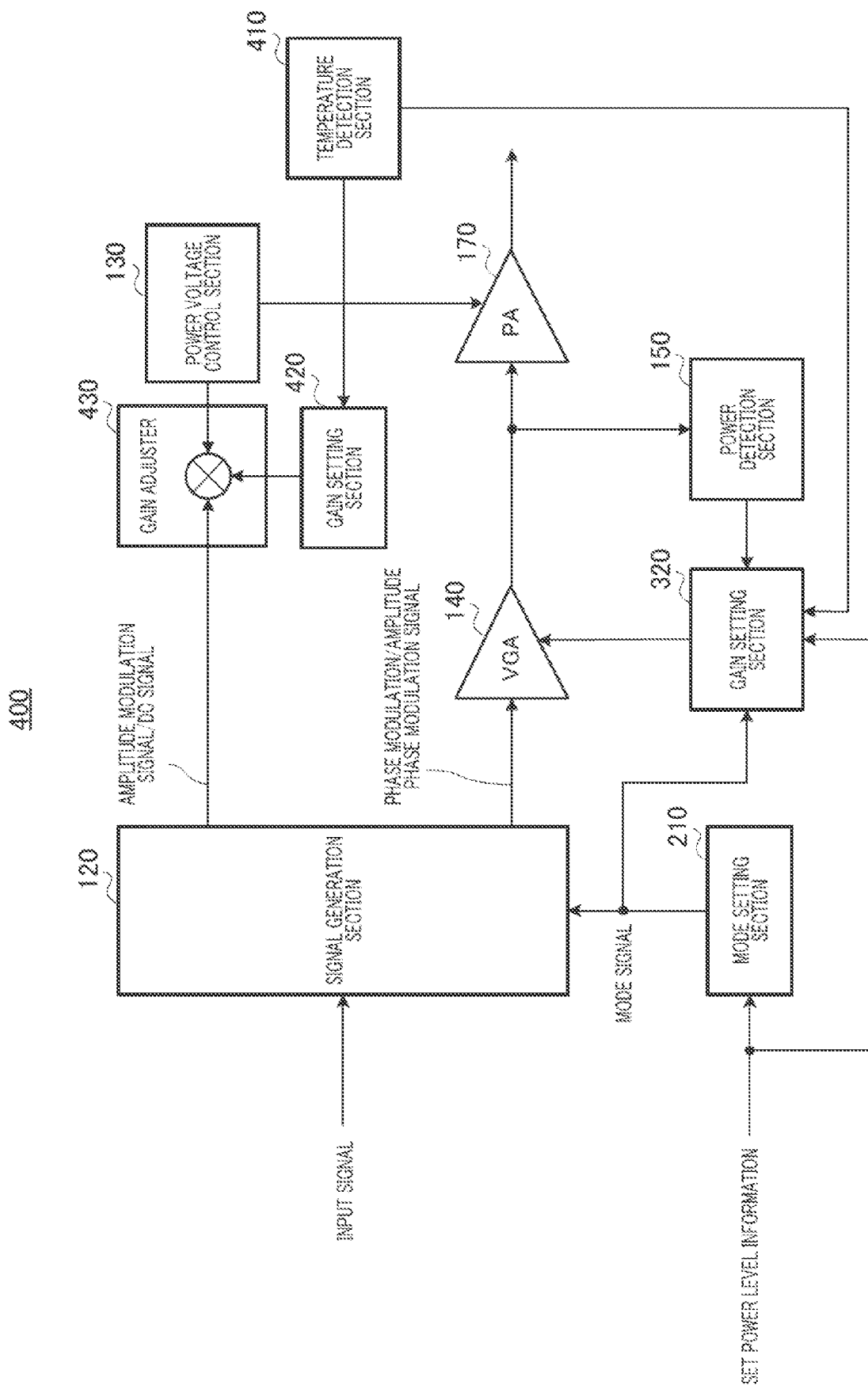
FIG. 7 is a diagram illustrating the configuration of main sections of a transmission circuit according to Embodiment 4 of the present invention.

FIG. 7 is a diagram illustrating the configuration of main sections of the transmission circuit according to an embodiment of the present invention. In the transmission circuit according to the present embodiment shown in FIG. 7, the same reference numerals as those of FIG. 6 are given to constituent elements common to the elements in FIG. 6 and the description thereof will be omitted. Compared to transmission circuit 300 of FIG. 6, in FIG. 7, transmission circuit 400 includes temperature detection section 410 instead of temperature detection section 310 and further includes gain setting section 420 and gain adjuster 430.

Like temperature detection section 310, temperature detection section 410 measures the temperature near or the temperature around high-frequency power amplifier 170. Temperature detection section 410 outputs the measurement result as temperature information to gain setting section 320 and gain setting section 420.

Gain setting section 420 sets the gain of gain adjuster 430. Gain setting section 420 receives as input at each slot the temperature information acquired by temperature detection section 410.

Based on the temperature information, gain setting section 420 estimates a voltage difference (hereinafter, referred to as a "voltage change amount") between the ideal power voltage to be output from power voltage control section 130 and the actual power voltage, in regard to the amplitude component signal output from signal generation section 120 to power voltage control section 130. Specifically, gain setting section 420 has a table in which the temperature change matches a voltage change amount by which the power voltage output from power voltage control section 130 is changed due to the temperature change. Gain setting section 420 reads the voltage change amount matching the temperature change from the table.

Gain setting section 420 sets the gain of gain adjuster 430 at the subsequent slot using the voltage change amount. Specifically, gain setting section 420 sets the gain of gain adjuster 430 to correct the estimated voltage change amount. For example, gain setting section 420 outputs a gain coefficient corresponding to the set gain to gain adjuster 430.

Gain adjuster 430 adjusts the level of the amplitude component signal output from signal generation section 120 based on the gain set by gain setting section 420, and outputs the adjusted amplitude component signal to power voltage control section 130.

For example, gain adjuster 430 includes a calculator. Gain adjuster 430 adjusts the level of the amplitude component signal by multiplying the amplitude component signal by the gain coefficient corresponding to the gain of gain adjuster 430 set by gain setting section 420 by the use of the calculator. Accordingly, it is possible to suppress the voltage change amount by which the power voltage output from power voltage control section 130 is changed due to the temperature change.

In the present embodiment, accordingly, temperature detection section 410 measures the vicinity temperature or the circumference temperature of high-frequency power amplifier 170. Based on the temperature information, gain setting section 420 estimates the voltage change amount which is the difference between the ideal power voltage corresponding to the amplitude component signal and the actual power voltage corresponding to the amplitude component signal. Further, based on the voltage change amount, gain setting section 420 sets the gain of the amplitude component signal adjusted by gain adjuster 430.

In this way, transmission circuit 400 corrects the gain change of variable gain amplifier 140 and the gain change by the temperature characteristic of high-frequency power amplifier 170. Further, transmission circuit 400 corrects the voltage change amount changed due to the temperature change of power voltage control section 130. Accordingly, it is possible to suppress the voltage change by the temperature characteristic of power voltage control section 130. Thus, it is possible to compensate the distorted component caused due to the temperature change, thereby suppressing the deterioration in the quality of the signal.

The above-described embodiments are examples of a preferred embodiment of the present invention. The invention is not limited thereto. The invention can be modified in various forms without departing from the gist of the invention.

The disclosure of Japanese Patent Application No. 2010-122979, filed on May 28, 2010, including the specification, drawings and abstract, is incorporated herein by reference in its entirety.

INDUSTRIAL APPLICABILITY

The transmission circuit and the transmission method according to the present invention are useful in, for example, mobile phones or communication apparatus including a wireless LAN, since it is possible to compensate the variation in the output power being caused due to the temperature change or the individual variability and occurring when the operation mode is switched, without increasing the circuit size, the transmission circuit which switches the operation mode between the linear operation mode and the nonlinear operation mode and it is possible to suppress the deterioration in the quality of the transmission signal.

REFERENCE SIGNS LIST 100, 200, 300, 400 Transmission circuit
110, 210 Mode setting section
120 Signal generation section
130 Power voltage control section
140 Variable gain amplifier
150 Power detection section
160, 220, 320, 420 Gain setting section
170 High-frequency power amplifier
310, 410 Temperature detection section
430 Gain adjuster

The invention claimed is:

1. A transmission circuit including a high-frequency power amplifier which has, as an operation mode, a nonlinear mode in which the high-frequency power amplifier operates as a nonlinear amplifier, and a linear mode in which the high-frequency power amplifier operates as a linear amplifier, the high-frequency power amplifier outputting a transmission signal, the transmission circuit comprising:
 a mode setting section that switches the operation mode to either the nonlinear mode or the linear mode in accordance with a set power level of the transmission signal;
 a signal generation section that converts an input signal into first and second signals in accordance with a mode signal which includes information regarding the operation mode set by the mode setting section;
 a power voltage control section that applies a power voltage corresponding to the first signal to the high-frequency power amplifier;
 a variable gain amplifier that amplifies the second signal;
 a detection section that detects a power level of the second signal amplified by the variable gain amplifier; and
 a first gain setting section that sets, irrespective of the operation mode, a gain of the variable gain amplifier to a value, which enables the variable gain amplifier to operate linearly and corresponds to a comparison result obtained through comparison between the detected power level and a target power level of the variable gain amplifier corresponding to the set power level.

2. The transmission circuit according to claim 1, wherein the signal generation section generates an amplitude modulation signal of the input signal as the first signal and generates a phase modulation signal of the input signal as the second signal in order to perform polar modulation in the nonlinear mode.

3. The transmission circuit according to claim 1, wherein the signal generation section generates a direct current signal as the first signal and generates an amplitude phase modulation signal of the input signal as the second signal in order to perform quadrature modulation in the linear mode.

4. The transmission circuit according to claim 1, wherein the first gain setting section sets the gain of the variable gain amplifier only when the operation mode is the linear mode.

5. The transmission circuit according to claim 1, further comprising:
 a temperature detection section that measures a vicinity temperature or a circumference temperature of the high-frequency power amplifier,
 wherein the first gain setting section estimates a gain change amount of the high-frequency power amplifier based on the temperature measurement result, and sets the gain of the variable gain amplifier based on a difference in the gain change amount between the operation modes when the operation mode is switched.

6. The transmission circuit according to claim 5, further comprising:
 a gain adjuster that adjusts a gain of the first signal; and
 a second gain setting section that estimates a voltage change amount, which is a difference between an ideal value of the power voltage corresponding to the first signal and an actual value of the power voltage corresponding to the first signal, based on the temperature measurement result, and sets the gain adjusted by the gain adjuster based on the voltage change amount.

7. A transmission method of a transmission circuit, the transmission circuit including a high-frequency power amplifier having, as an operation mode, a nonlinear mode in which the high-frequency power amplifier operates as a nonlinear amplifier, and a linear mode in which the high-frequency power amplifier operates as a linear amplifier, the high-frequency power amplifier outputting a transmission signal, the transmission method comprising:
 switching the operation mode to either the nonlinear mode or the linear mode in accordance with a set power level of the transmission signal;
 converting an input signal into first and second signals in accordance with the operation mode;
 applying a power voltage corresponding to the first signal to the high-frequency power amplifier;
 amplifying the second signal using a variable gain amplifier;
 detecting a power level of the second signal amplified by the variable gain amplifier; and
 adjusting, irrespective of the operation mode, a gain of the variable gain amplifier to a value, which enables the variable gain amplifier to operate linearly and corresponds to a comparison result obtained through comparison between the detected power level and a target power level of the variable gain amplifier corresponding to the set power level.

* * * * *